(12) United States Patent
Chiu et al.

(10) Patent No.: US 12,591,006 B2
(45) Date of Patent: Mar. 31, 2026

(54) SEMICONDUCTOR DEVICE TESTER

(71) Applicant: Taiwan Semiconductor Manufacturing Company Limited, Hsin-Chu (TW)

(72) Inventors: Ting-Yu Chiu, Hsinchu County (TW); Yi-Neng Chang, Hsinchu County (TW); Shin-Han You, Taoyuan City (TW); Chien Fang Huang, Hsinchu County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 175 days.

(21) Appl. No.: 18/372,290

(22) Filed: Sep. 25, 2023

(65) Prior Publication Data

US 2025/0102568 A1    Mar. 27, 2025

(51) Int. Cl.
| | |
|---|---|
| *G01R 31/28* | (2006.01) |
| *G01R 1/04* | (2006.01) |
| *G01R 1/067* | (2006.01) |
| *G01R 1/073* | (2006.01) |
| *G01R 31/02* | (2006.01) |

(52) U.S. Cl.
CPC ..... *G01R 31/2896* (2013.01); *G01R 31/2887* (2013.01); *G01R 31/2889* (2013.01); *G01R 31/2893* (2013.01)

(58) Field of Classification Search
CPC ........ G01R 31/00; G01R 31/02; G01R 31/28; G01R 31/2874; G01R 31/2887; G01R 31/2889; G01R 31/2893; G01R 31/2896; G01R 1/04; G01R 1/067; G01R 1/073
See application file for complete search history.

(56) References Cited

U.S. PATENT DOCUMENTS

| | | | | |
|---|---|---|---|---|
| 2004/0227534 | A1* | 11/2004 | Mueller | G01R 31/2891 |
| | | | | 73/866.5 |
| 2010/0182029 | A1* | 7/2010 | Sekino | G01R 1/06783 |
| | | | | 324/750.08 |
| 2021/0293880 | A1 | 9/2021 | Oh et al. | |

FOREIGN PATENT DOCUMENTS

| | | |
|---|---|---|
| CN | 101040379 A | 9/2007 |
| TW | 201811643 A | 4/2018 |

OTHER PUBLICATIONS

First Office Action cited in corresponding Taiwanese patent Application No. 112144051, dated Jun. 18, 2024, 14 pages.

* cited by examiner

*Primary Examiner* — Neel D Shah
(74) *Attorney, Agent, or Firm* — Cooper Legal Group, LLC

(57) ABSTRACT

A test system and method of testing are provided. In some embodiments, a system for testing an integrated circuit package includes a device tester. The device tester includes a socket, a cylinder head unit engageable with the socket, and a pressure regulator. The socket includes a first pressure cylinder configured to engage a first region of the integrated circuit package and a second pressure cylinder configured to engage a second region of the integrated circuit package. The pressure regulator is configured to provide at gas at a first pressure to the first pressure cylinder and to provide the gas at a second pressure different than the first pressure to the second pressure cylinder.

20 Claims, 6 Drawing Sheets

900

902

904

COMPUTER
INSTRUCTIONS

906

0101101000101010101
0110101011011010111
00...

908

COMPUTER READABLE MEDIUM

1000

1012

1014

PROCESSING UNIT
1016

MEMORY
1018

STORAGE
1020

OUTPUT DEVICE(S)
1022

INPUT DEVICE(S)
1024

COMMUNICATION
CONNECTION(S)
1026

1028

NETWORK

COMPUTING DEVICE
1030

SEMICONDUCTOR DEVICE TESTER

BACKGROUND

A semiconductor arrangement, such as a semiconductor wafer, comprises a plurality circuitry arrangements, such as integrated circuits. The integrated circuits are spaced apart by scribe lines. A separation process, such as a wafer sawing process, is performed along the scribe lines to separate and detach integrated circuits from one another. One or more semiconductor die are packaged in a integrated circuit package to provide a three dimensional integrated circuit package (3DIC) with stacked die, a system on an integrated circuit (SoIC) package, an integrated fan-out (InFO) package, a chip on wafer on substrate (CoWoS) package, or some other type of integrated circuit package. A final tester system connects to contact sites, such as solder balls, contact pads, or the like, on the integrated circuit package to test functionality of the integrated circuits in the integrated circuit package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
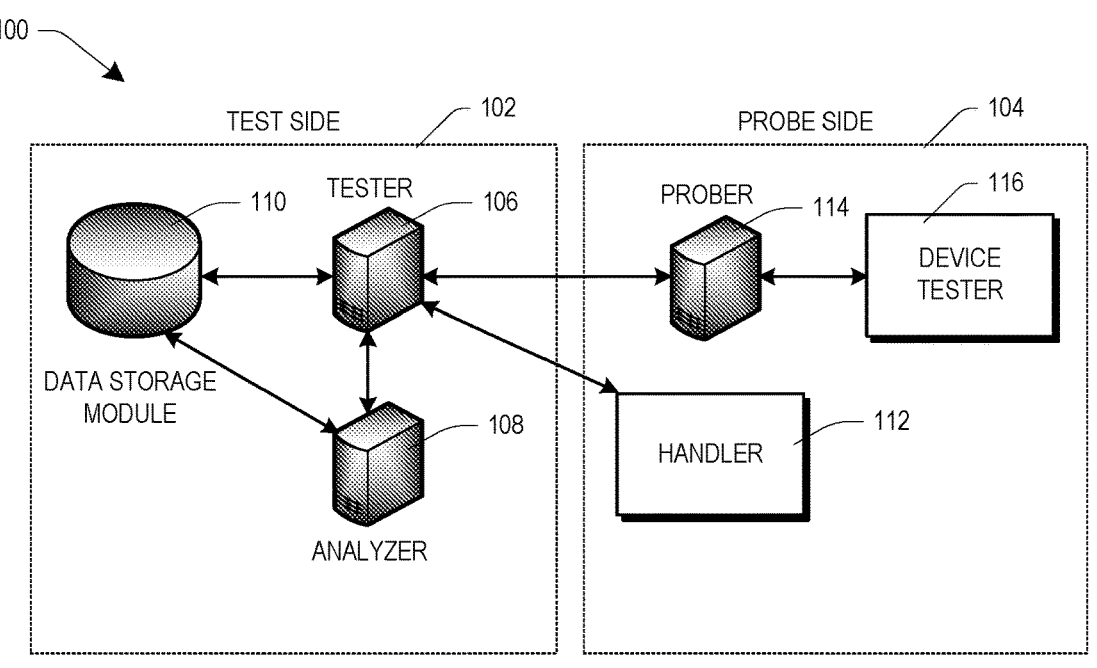
FIG. 1 is a block diagram of a system for integrated circuit package testing, in accordance with some embodiments.

The following disclosure provides many different embodiments, or examples, for implementing different features of the provided subject matter. Specific examples of components and structures are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower." "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application relates to an integrated circuit package tester and a method for testing an integrated circuit package. In semiconductor processing, dies or chips are formed in groups on wafers, permitting bulk processing of the dies. Dies are singulated and packaged. Multiple dies of multiple types may be packaged together, either in a stacked arrangement, a side-by-side arrangement, or both. The integrated circuit packages are tested using device testers, which have probe pins that may contact the contact pads (or metal bumps, solder balls, etc.) of the devices-under-test (DUTs). The integrated circuit packages may exhibit a degree of warpage, such as from elevated temperatures. The testing of the integrated circuit packages accounts for such warpage by using spring-loaded probe pins and by applying a force to the DUT to engage the probe pins. If some of the contact pads of the DUT are not be able to be in contact with some of the probe pins during the probing, the DUT may be mistakenly identified as a faulty device. Increasing the force to ensure contact can potentially damage the integrated circuit package or the device tester.

According to some embodiment, a device tester comprises pressure cylinders that may be individually controlled to affect the force applied to the integrated circuit package. Pressure cylinders may be individually pressurized or pressurized as a group using a shared pressure cavity. For example, a first pressure may be applied to a first cylinder to apply a first force to the integrated circuit package, and a second pressure may be applied to a second cylinder to apply a second force different than the first force to the integrated circuit package. Using different applied pressures allows the appropriate force to be applied to the semiconductor die in the integrated circuit package associated with the pressure cylinder based on a pin count of the semiconductor die to account for the counter force from conductive pins in the device tester. The use of a force that depends on the pin count reduces the likelihood of damage to the integrated circuit package, damage to the semiconductor dies in the integrated circuit package, or damage to the device tester.

FIG. 1 is a block diagram of a system 100 for integrated circuit package testing, in accordance with some embodiments. In some embodiments, the system 100 comprises a test side 102 and a probe side 104. The test side 102 manages and controls one or more sets of equipment on the probe side 104. The test side 102 comprise a tester 106, an analyzer 108, and a data storage module 110. The probe side 104 handles the integrated circuit packages, physically manipulates the probes, and performs the actual testing of the integrated circuit packages. The probe side 104 comprises a handler 112, a prober 114, and a device tester 116.

The tester 106 sends instructions to the prober 114 and the handler 112 on the probe side 104. The tester 106 also receives test data from the prober 114. In some embodiments, the tester 106 retrieves test and probe parameters from a data storage module 110 on the test side, and transmits that data to the prober 114 for testing integrated circuit packages and probe contact quality. In some embodiments, the analyzer 108 that analyzes test results received by the tester 106 to determine whether an integrated circuit packages passes a functional test and generates probe or test parameters based on at least one of baseline parameters or previous test data. In some embodiments, the analyzer 108 also determines whether an integrated circuit package that fails the test should be retested with modified probe contact parameters, and whether the base parameters for testing integrated circuit packages should be modified. The prober 114 controls a device tester 116, causing probes on the device tester 116 to contact an integrated circuit package for testing. The handler 112 retrieves and engages integrated circuit packages with the device tester 116 while the integrated circuit package is tested with the device tester 116. After testing, the handler 112 removes the integrated circuit package, and replaces the integrated circuit package with a different integrated circuit package for testing. In some embodiments, multiple integrated circuit packages are tested in parallel.

In some embodiments, the tester 106 comprises a computer system having instructions stored on a non-transitory computer readable medium for generating probing and test instructions that are, at least in part, determined according to the type of integrated circuit package being tested and test parameters generated from tests of previous integrated circuit package or previous tests of the same integrated circuit package. The tester 106 comprises a processor for executing instructions. In some embodiments, the data storage module 110 is a database, file, cloud storage system, or other data storage system that stores data on a non-transitory computer readable medium such as a hard drive, a solid state drive, a computer memory, such as random-access memory (RAM), synchronous dynamic random-access memory (SDRAM), flash memory, or the like.

In some embodiments, the analyzer 108 is in signal communication with the data storage module 110 and the tester 106. Additionally, in some embodiments, the analyzer 108 is integrated into the tester 106, and in other embodiments, the analyzer 108 is a computer system separate from, but connected to, the tester 106. The analyzer 108 determines the probe parameters and device test parameters and stores the parameters in the data storage module 110 or transmits the parameters directly to the tester 106. The tester 106 uses the probe parameters and device test parameters to generate the instructions for controlling the prober 114. The analyzer 108 fetches historical test data from the data storage module 110 and optimizes the testing of integrated circuit package to increase performance by ensuring that the probe parameters result in a good contact with the devices for testing. The handler 112 is a computer system or control system that, in some embodiments, receives instructions from the tester 106 to load a particular integrated circuit package into engagement with the device tester 116. The handler 112 may include a robot arm or manipulator.

Figure 2:
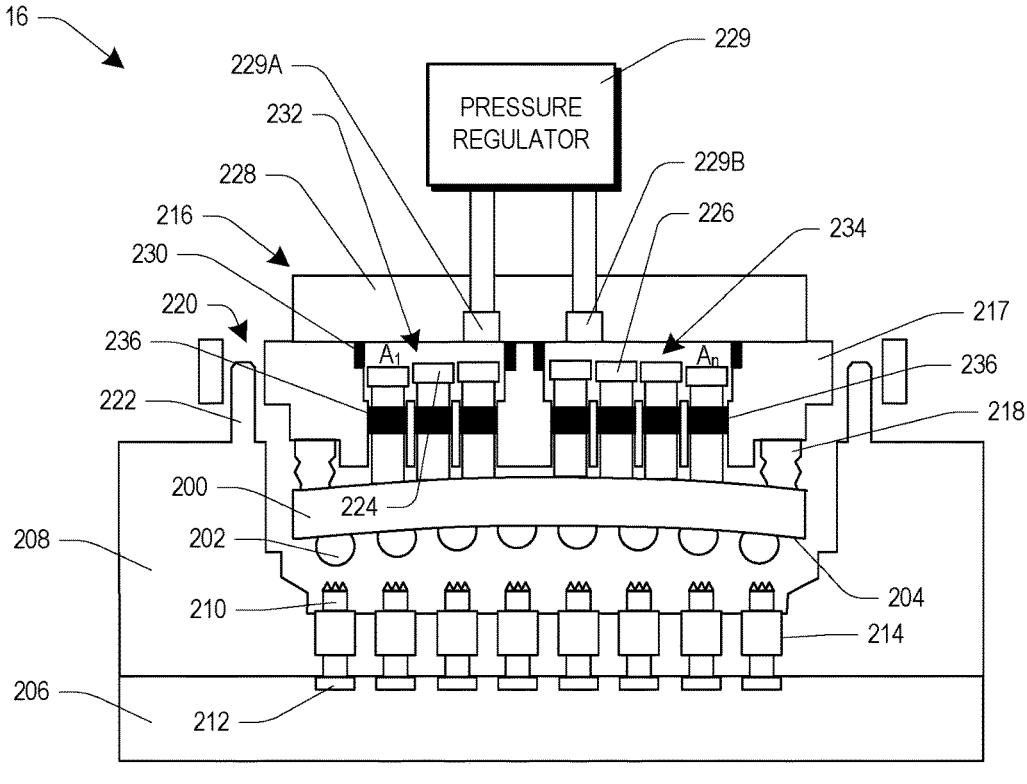
FIG. 2 illustrates a cross-sectional view of a device tester, in accordance with some embodiments.

FIG. 2 illustrates a cross-sectional view of the device tester 116, in accordance with some embodiments. Referring to FIG. 2, the device tester 116 is configured for testing an integrated circuit package 200. In some embodiments, the device tester 116 is configured to perform a final test (FT) or a system level test (SLT) on the integrated circuit package 200, but the disclosure is not limited thereto. The integrated circuit package 200 has a plurality of electrical terminals 202 disposed on a contact surface 204 of the integrated circuit package 200. In some embodiments, the integrated circuit package 200 comprises a 3DIC package, a SoIC package, an InFO package, a CoWoS package, or some other package type. In some embodiments, a size of the integrated circuit package 200 may be over 45 mm×45 mm. The integrated circuit package 200 may be prone to warpage under elevated temperatures due to different coefficients of thermal expansions (CTEs) between different materials in the integrated circuit package 200. As a result, the contact surface 204 of the integrated circuit package 200 may not be a flat surface, but rather may be a curved surface or any form of uneven surface.

In some embodiments, the device tester 116 includes a base 206, a socket 208, and conductive pins 210. In some embodiments, the base 206 includes electrical contacts 212 that interface with the conductive pins 210. The socket 208 is positioned on the base 206 and includes through holes 214 distributed in the socket 208. The through holes 214 may be evenly distributed in the socket 208 and additional through holes 214 and conductive pins 210 may be provided at positions into or out of the page in FIG. 2. The profile of the socket 208 corresponds to the profile of the integrated circuit package 200. The conductive pins 210 are movably disposed in the through holes 214 and are electrically connected to the electrical contacts 212. In some embodiments, a passivation layer may be formed on a top surface of each of the electrical contacts 212. The passivation layer may be formed by, for example, an electroless plating process and includes Aurum (Au) or any other suitable material. The passivation layer reduces oxidation of the electrical contacts 212 under high temperature caused by high electric current.

In some embodiments, the conductive pins 210 are in temporary electrical connections with the electrical contacts 212 for the device tester 116 to perform tests on the integrated circuit package 200. In some embodiments, the device tester 116 is configured and implemented for the electrical testing of the integrated circuit package 200, so electrical currents or voltages can be applied to or received by the electrical contacts 212. In some embodiments, the conductive pins 210 are spring loaded, also referred to as pogo pins, for establishing electrical connections between the electrical contacts 212 of the base 206 and the electrical terminals 202 of the integrated circuit package 200.

In some embodiments, the socket 208 is attached to the base 206. The base 206 may be secured onto a printed circuit board, for example, by attaching a frame of the base 206 onto the printed circuit board. In some embodiments, the conductive pins 210 include signal pins and at least one ground pin that are used for probing the integrated circuit package 200. In addition, the conductive pins 210 include power supply pins, which may have the same structure as the signal pins or the ground pin(s). The base 206 may include at least one of active or passive devices (not shown in FIG. 2). A wide variety of devices, such as controllers, processors, transistors, capacitors, resistors, any combinations thereof, and the like can be used to generate the structural and functional requirements of the design for the device tester 116. The active or passive devices can be formed using any suitable methods, and may be embedded in the base 206 or mounted on the base 206 by a surface-mount technique. The disclosure is not limited thereto.

The device tester 116 comprises a cylinder head unit 216 for holding the integrated circuit package 200 and interfacing the integrated circuit package 200 with the socket 208.

The cylinder head unit 216 comprises a body 217 with a chuck 218, such as a vacuum nozzle, for holding the integrated circuit package 200. A guide hole 220 defined in the body 217 of the cylinder head unit 216 engages a post 222 defined in the socket 208 to align the cylinder head unit 216 and the socket 208. FIG. 2 illustrates the cylinder head unit 216 partially engaged with the socket 208.

The cylinder head unit 216 comprises pressure cylinders 224, 226 for applying a force to the integrated circuit package 200 to engage the electrical terminals 202 of the integrated circuit package 200 with the conductive pins 210. The cylinder head unit 216 comprises a cover 228 that engages seals 230 on the body 217 to define pressure cavities 232, 234 between the body 217 and the cover 228. Seals 236, such as O-rings, may be provided between the body 217 and the pressure cylinders 224, 226. For example the pressure cavity 232 may be in fluid communication with the pressure cylinders 224, and the pressure cavity 234 may be in fluid communication with the pressure cylinders 226. The number of pressure cavities and the number of pressure cylinders in each pressure cavity may vary. Additional pressure cavities and pressure cylinders may be provided at positions into or out of the page in FIG. 2.

In some embodiments, a pressure regulator 229, such as a digital pressure regulator, is configured to provide different gas supplies at different pressures to the pressure cavities 232, 234 at gas inlets 229A, 229B to affect the force applied by the pressure cylinders 224, 226 such that a force applied by the pressure cylinders 224 may be different than a force applied by the pressure cylinders 226. The pressure parameters for the pressure regulator 229 may be controlled by the prober 114. In some embodiments, the inlet pressure provided to the pressure regulator 229 is about 0.18 MPa. The gas provided by the pressure regulator 229 at the gas inlet may be air, an inert gas, such as nitrogen or argon, or some other supply gas. The pressure regulator 229 may receive the gas from the ambient atmosphere, such as through a filter, or the gas may be provided to the pressure regulator 229 by a gas reservoir.

In some embodiments, the pressure provided by the pressure regulator 229 and the corresponding force applied by the particular pressure cylinders 224, 226 are proportional to a pin count of a component of the integrated circuit package 200 positioned under the pressure cylinders 224, 226. For example, the integrated circuit package 200 may include one or more central processing unit (CPU) dies, one or more memory dies, a digital signal processor die, a graphics die, an input/output (I/O) controller die, a bus controller die, or other dies for some other functional units. Each of the dies in the integrated circuit package 200 may have a different pin density. The force applied to the integrated circuit package 200 by the pressure cylinders 224, 226 is countered by the spring force of the conductive pins 210. As the applied force increases, the conductive pins 210 compress until a maximum travel for the conductive pins 210 is reached. Applying an additional force after a conductive pin 210 has exhausted its range of motion can damage the conductive pin 210.

The prober 114 may retrieve probe parameters from the data storage module 110 for configuring the pressure regulator 229 to provide different pressures to different pressure cylinders 224, 226. For example, the prober 114 may access a look-up table that matches a particular pressure cavity 232, 234 and its associated pressure cylinders 224, 226 to a pressure value. In some embodiments, one pressure cylinder provided in one pressure cavity applies force to a single component of the integrated circuit package 200. In some embodiments, more than one pressure cylinder in a pressure cavity applies force to a single component of the integrated circuit package 200. The force applied by a set of pressure cylinders (which may include one or more pressure cylinders) is based on the pressure provided by the pressure regulator 229 and the sum of the surface areas, $A_x$, of the pressure cylinders in the set. Although the pressure cylinders 224, 226 are illustrated as being the same size in FIG. 2, the size and corresponding surface area may vary between pressure cylinders 224, 226. In some embodiments, a maximum force parameter associated with a set of pressure cylinders is determined based on the pin count, $P_C$, of the component of the integrated circuit package 200 positioned under the pressure cylinder 224, 226 and a pin force, $P_F$, (at maximum deflection) of a conductive pin 210. The applied force for a test of the integrated circuit package 200 generated by the applied pressure, $P_1$, is limited based on the equation:

$$\text{Applied Force (Test): } \sum (A_1 \ldots A_N) \times P_1 <= \text{Maximum Force:} P_F * P_C. \quad (1)$$

Figure 3:
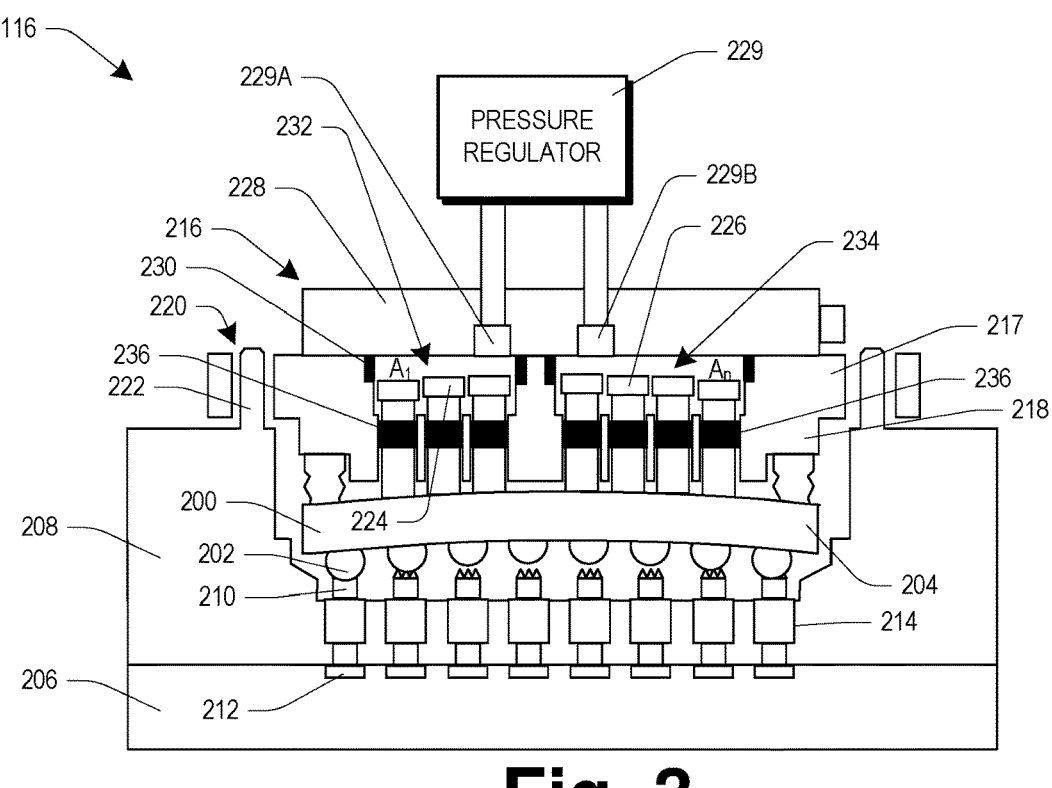
FIG. 3 illustrates a cylinder head unit fully engaged with a socket and with a preliminary pressure being applied, in accordance with some embodiments.

FIG. 3 illustrates the cylinder head unit 216 fully engaged with the socket 208 and with a preliminary pressure being applied by the pressure regulator 229 to engage the electrical terminals 202 disposed on the contact surface 204 of the integrated circuit package 200 with the conductive pins 210, in accordance with some embodiments. Due to warpage of the integrated circuit package 200, not all of the electrical terminals 202 may be engaged by the conductive pins 210 during the preliminary engagement between the integrated circuit package 200 and the socket 208. The number and location of electrical terminals 202 that are engaged by the conductive pins 210 during the preliminary engagement using the preliminary pressure may be an indication of the degree of warpage. The preliminary engagement may be used to verify alignment between the integrated circuit package 200 and the socket 208. In some embodiments, the preliminary pressure corresponds to a force of about one third of the applied force for a test of the integrated circuit package 200 in Equation 1.

$$\text{Applied Force (Prelim): } \sum (A_1 \ldots A_N) \times P_1 <= \quad (2)$$
$$\text{Maximum Force: } (P_F * P_C)/3.$$

Figure 4:
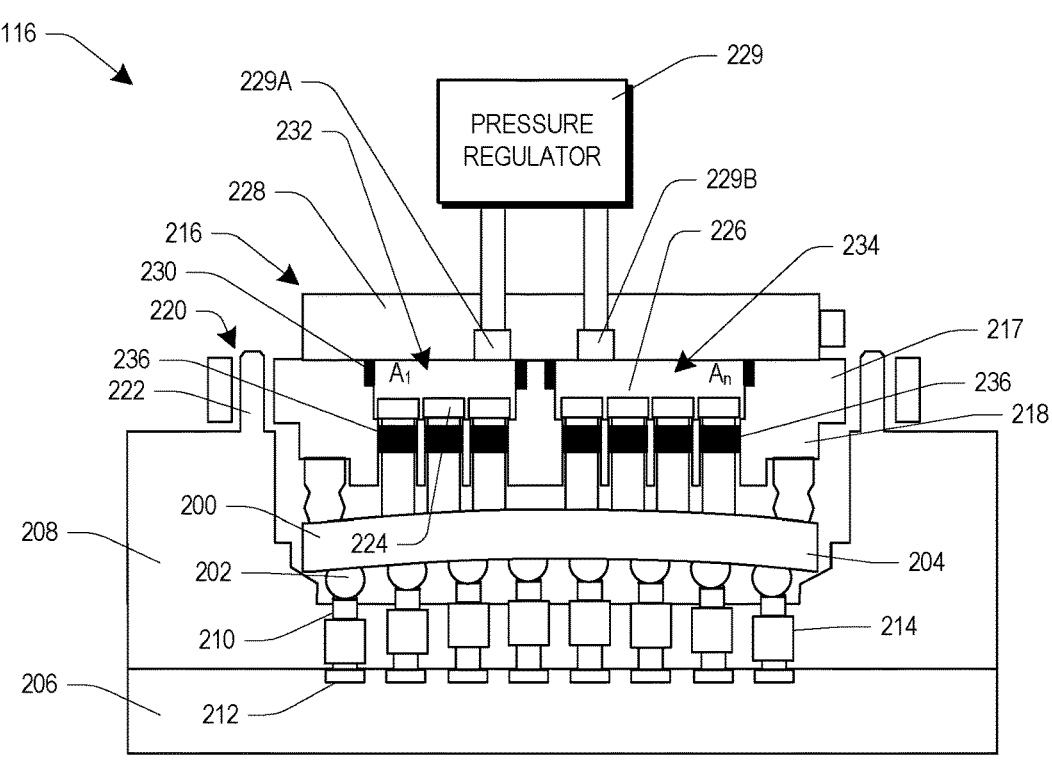
FIG. 4 illustrates a cylinder head unit fully engaged with the socket and with a testing pressure being applied, in accordance with some embodiments.

FIG. 4 illustrates the cylinder head unit 216 fully engaged with the socket 208 and with a testing pressure being applied by the pressure regulator 229 to engage the electrical terminals 202 disposed on the contact surface 204 of the integrated circuit package 200 with the conductive pins 210, in accordance with some embodiments. The testing pressure causes deflection of the conductive pins 210 to facilitate full engagement between the electrical terminals 202 and the conductive pins 210. The quality of the contact between the conductive pins 210 and the electrical terminals 202 disposed on the contact surface 204 of the integrated circuit package 200 affects the accuracy of the test results for the integrated circuit package 200. Insufficient contact between the conductive pins 210 and the electrical terminals 202 may result in a failed test result for an integrated circuit package 200 that actually functions correctly.

The applied pressure, $P_1$, for a particular pressure cavity 232, 234 may be selected such that the applied force is a fractional multiplier of the maximum force, such as 95%. The prober 114 may dynamically adjust the fraction employed for a particular integrated circuit package 200. For example, when a particular integrated circuit package 200 receives a failed test result in the functional test using the nominal fraction, the prober 114 may repeat the test using a higher fractional multiplier, such as 98%. The increased risk of damage to the integrated circuit package 200 that failed the initial test by repeating the test using a higher pressure may be mitigated by the chance of achieving a passing result for the integrated circuit package 200. Only using the higher pressure for integrated circuit packages 200 that initially fail only subjects integrated circuit packages 200 that would otherwise be scrapped to the additional risk of damage from a higher force.

The degree of warpage determined based on the engagement present using the preliminary pressure may also be used to determine the fractional multiplier. Integrated circuit packages 200 with less warpage may use a reduced fractional multiplier, such as 93%, to reduce the risk of breakage while still achieving passing test results. The test pressures applied to the pressure cylinders 224, 226 may be modified from baseline values prior to testing the integrated circuit package 200.

Figure 5:
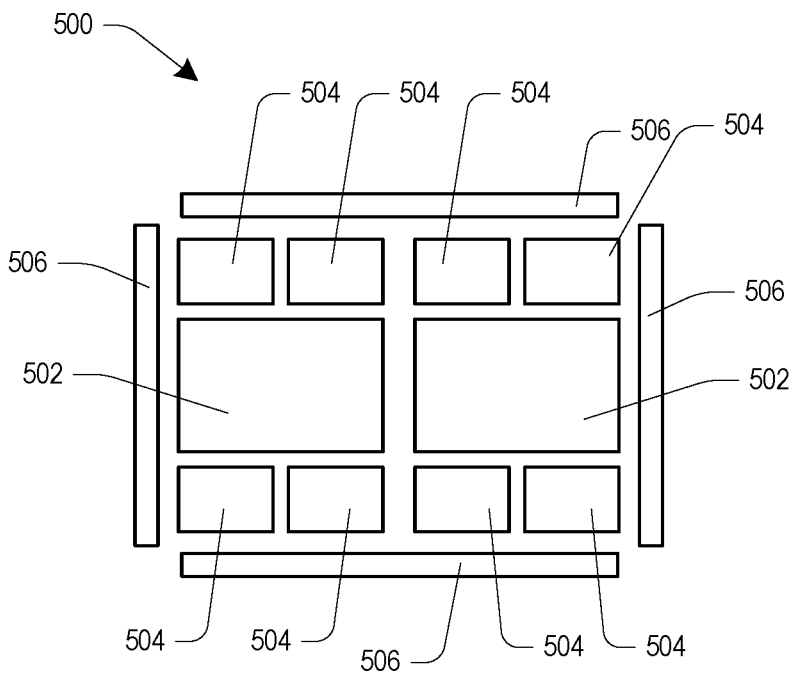
FIGS. 5 and 6 are top views of arrays of pressure cylinders, in accordance with some embodiments.

Referring to FIG. 5, a top view of an array 500 of pressure cylinders 502, 504, 506 is provided, in accordance with some embodiments. In some embodiments, the arrangement of the pressure cylinders 502, 504, 506 corresponds to the die regions of the integrated circuit package 200. For example, the pressure cylinders 502 may be positioned over CPU die regions, the pressure cylinders 504 may be positioned over memory die regions, and the pressure cylinders 506 may be positioned over portions of a seal ring provided in the integrated circuit package 200 to surround the CPU and memory dies. Pressure values for the pressure cylinders 502 may be determined based on the pin count of the CPU dies, pressure values for the pressure cylinders 504 may be determined based on the pin count of the memory dies, and pressure values for the pressure cylinders 506 may be determined based on the pin count of the seal ring portions. In some embodiments, when the pin counts are the same, the pressure cylinders 502 may be served by a shared pressure cavities, and the pressure cylinders 504 may be grouped into upper and lower seats with each set being served by a shared pressure cavity. The pressure cylinders 506 may be served by separate pressure cavities.

Figure 6:
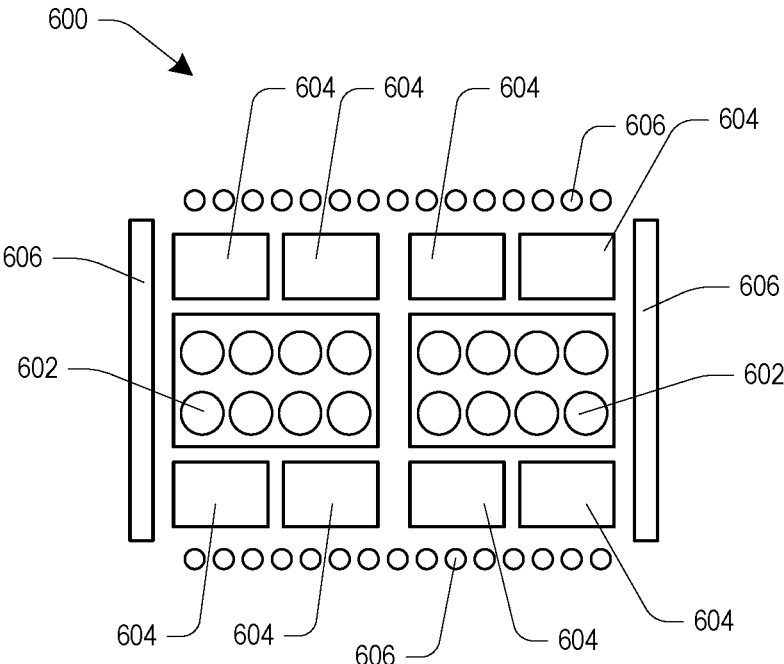

Referring to FIG. 6, a top view of an array 600 of pressure cylinders 602, 604, 606 is provided, in accordance with some embodiments. In some embodiments, the arrangement of the pressure cylinders 602, 604, 606 corresponds to the arrangement of the dies in the integrated circuit package 200. For example, the pressure cylinders 602 are arranged in sets, with each set being positioned cover a CPU die. The sets of pressure cylinders 602 may be served by a shared pressure cavity or one pressure cavity may be provided for each set. The pressure cylinders 604 may be individual pressure cylinders positioned over memory dies. The pressure cylinders 604 may be grouped into upper and lower seats with each set being served by a shared pressure cavity. The pressure cylinders 606 may be arranged in sets positioned over portions of a seal ring provided in the integrated circuit package 200 to surround the CPU and memory dies. Each set of the pressure cylinders 606 may be served by a separate pressure cavity.

Figure 7:
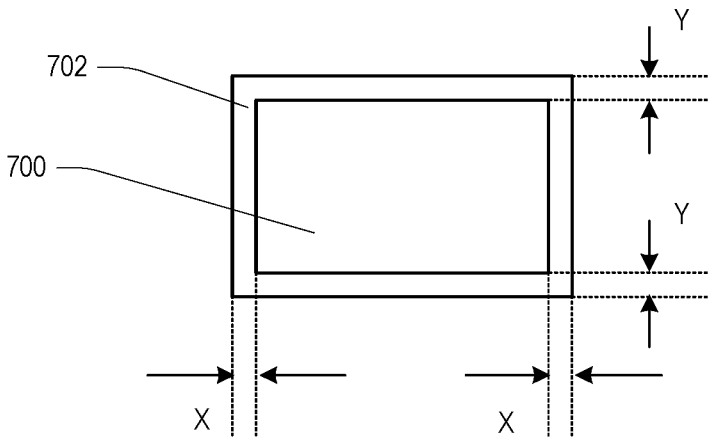
FIG. 7 is a top view of a pressure cylinder over a die, in accordance with some embodiments.

Referring to FIG. 7, a top view of a pressure cylinder 700 over a die 702 is provided, in accordance with some embodiments. In the integrated circuit package 200, the dies, such as the die 702, may be surrounded by a protective material, such as an epoxy material. The protective material is softer than the die 702. To mitigate applying pressure to the edge of the die 702 or the protective material, and potentially causing the die 702 to crack, the pressure cylinder 700 may be sized such that the contact area of the pressure cylinder 700 is smaller than the die 702. For example, a margin in the x-direction, X, and a margin in the y-direction, Y, may be provided. In some embodiments, $X \geq 0.2$ mm and $X \geq 0.2$ mm.

Figure 8:
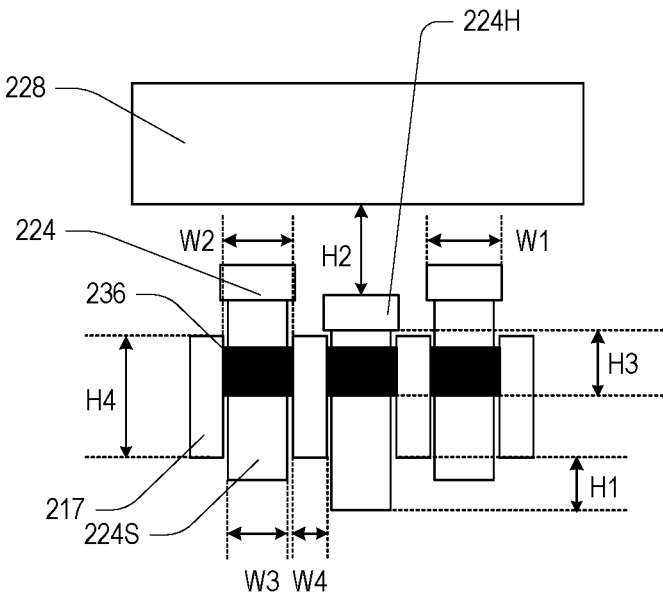
FIG. 8 is an expanded view illustrating dimensions and spacings, in accordance with some embodiments.

Referring to FIG. 8, an expanded view illustrating dimensions and spacings associated with the body 217, the pressure cylinders 224, the cover 228, and the seals 236 is provided, in accordance with some embodiments. With the pressure cylinder 224 fully displaced, the upper dimension $H2 \geq$ the extension dimension $H1 \geq 0.1$ mm to account for package warpage. The thickness of the body 217 $H4 \geq$ distance between the head 224H of the pressure cylinder 224 and the bottom of the seal 236 H3 to ensure overlap with a shaft 224S of the pressure cylinder 224 and the seal 236. The width of the head 224H W1>the width of the seal 236 W2>the width of the shaft 224S of the pressure cylinder 224 W3 to ensure function of the seal 236. The spacing W4 between the pressure cylinders 224 defined by the body 217 is about $\geq 0.5$ mm.

Figure 9:
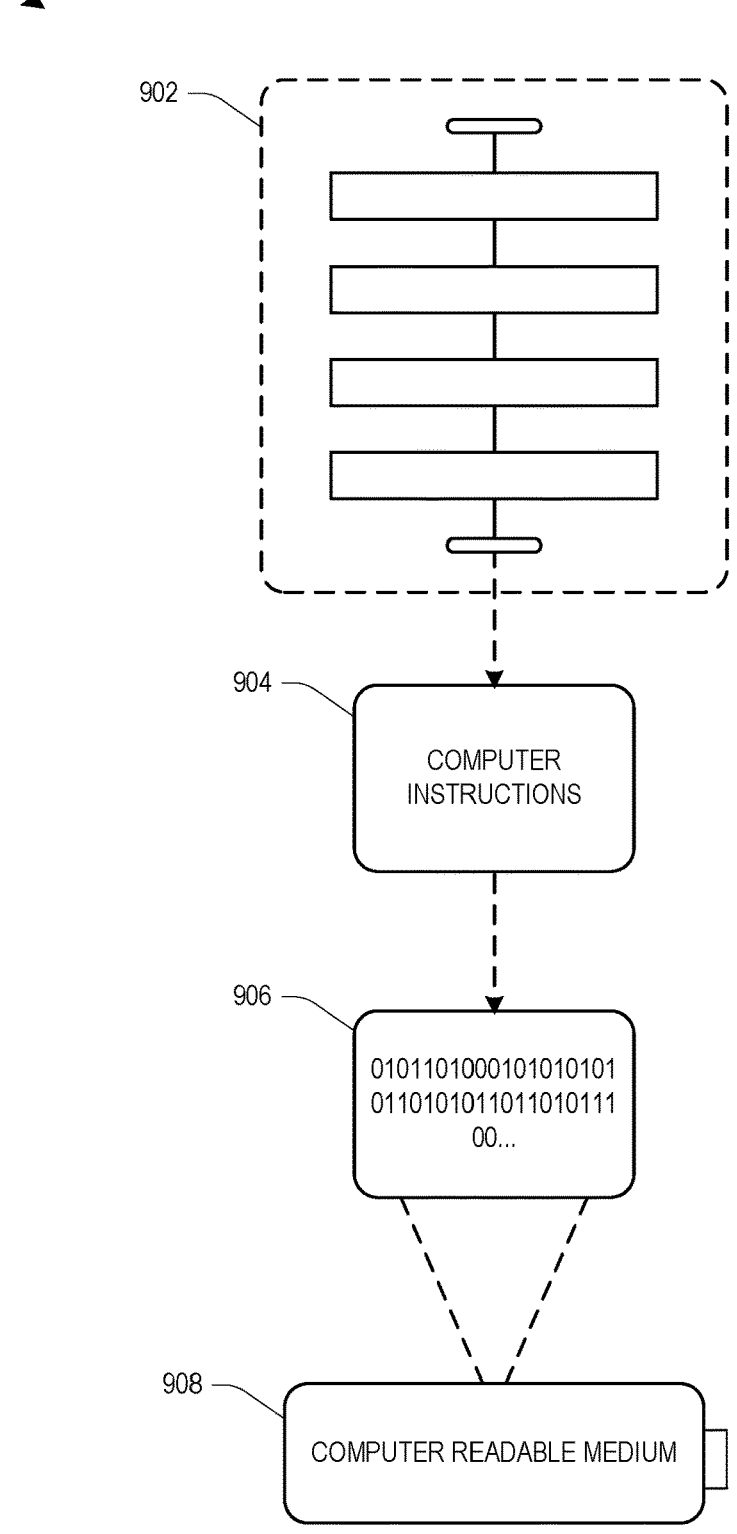
FIG. 9 is an illustration of an example computer-readable medium wherein processor-executable instructions configured to embody one or more of the provisions set forth herein may be comprised, in accordance with some embodiments.

Another embodiment involves a computer-readable medium comprising processor-executable instructions configured to implement one or more of the techniques presented herein. An example embodiment of a computer-readable medium or a computer-readable device that is devised in these ways is illustrated in FIG. 9, wherein the embodiment 900 comprises a computer-readable medium 908, such as a compact disc-recordable (CD-R), digital video disc-recordable (DVD-R), flash drive, a platter of a hard disk drive, etc., on which is encoded computer-readable data 906. This computer-readable data 906, such as binary data comprising a plurality of zero's and one's as shown in FIG. 9, in turn comprises a set of processor-executable computer instructions 904 configured to operate according to one or more of the principles set forth herein. In one such embodiment 900, the processor-executable computer instructions 904 are configured to perform a method 902, such as at least some of the steps described above for control of the device tester 116, for example. In another embodiment, the processor-executable computer instructions 904 are configured to implement a system, such as at least some of the example system 100 of FIG. 1, for example. Many such computer-readable media are devised by those of ordinary skill in the art that are configured to operate in accordance with the techniques presented herein.

Figure 10:
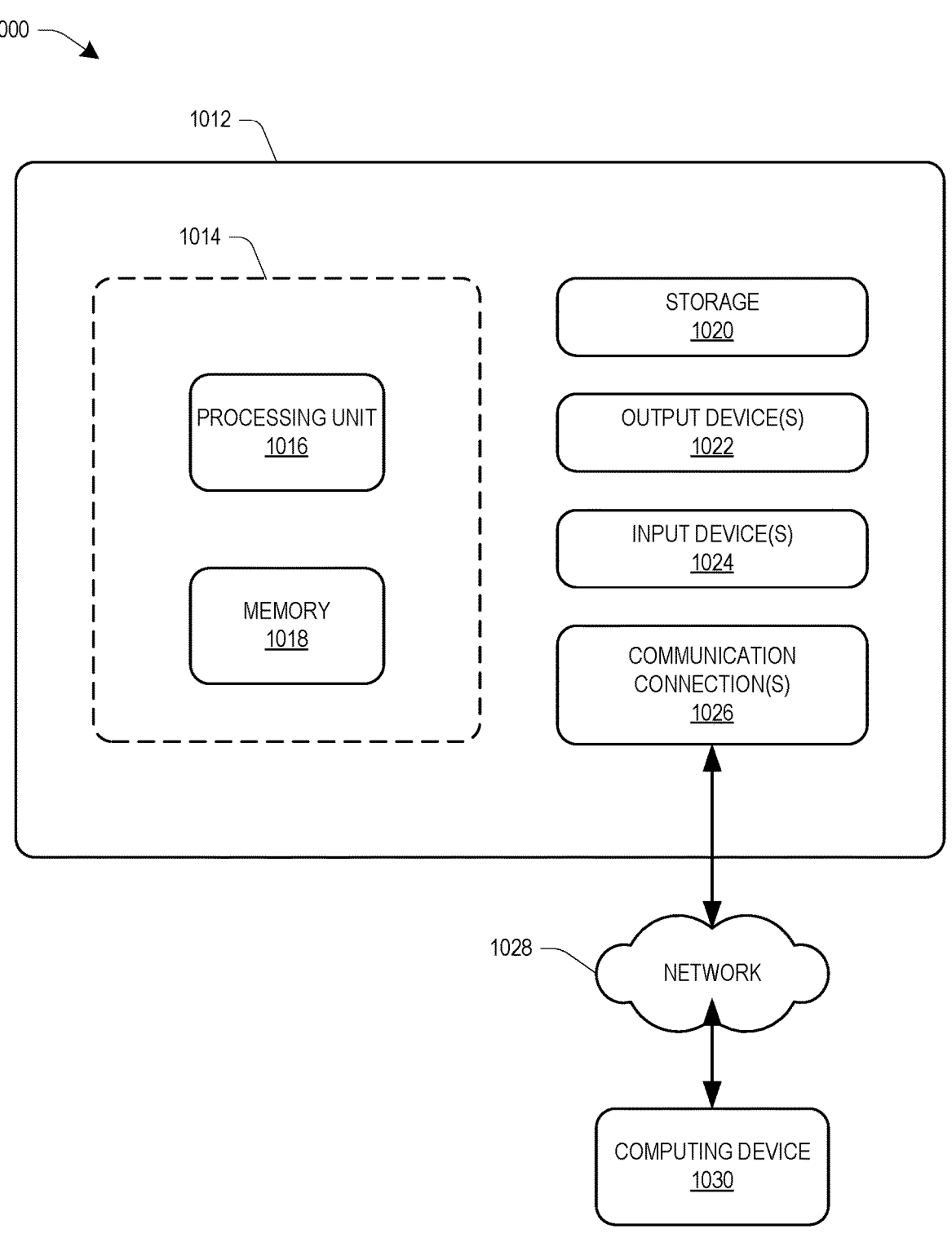
FIG. 10 is a diagram of a computing environment to implement embodiments of one or more of the provisions set forth herein, in accordance with some embodiments.

FIG. 10 and the following discussion provide a brief, general description of a suitable computing environment to implement embodiments of one or more of the provisions set forth herein. The operating environment of FIG. 10 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 10 illustrates an example of a system 1000 comprising a computing device 1012 configured to implement one or more embodiments provided herein, such as the tester 106, the analyzer 108, or the prober 114 illustrated in FIG. 1. In one configuration, computing device 1012 includes at least one processing unit 1016 and memory 1018. Depending on the exact configuration and type of computing device, memory 1018 may be volatile, such as RAM, nonvolatile, such as read-only memory (ROM), flash memory, etc., or some combination of the two. This configuration is illustrated in FIG. 10 by dashed line 1014. The processing unit 1016 may comprise general and specialized computing devices, such as CPU clusters and hardware accelerator clusters that allow for task optimization and parallel processing. The memory 1018 and storage 1020 may be global memory and storage shared by the clusters.

In other embodiments, device 1012 includes additional features or functionality. For example, device 1012 also includes additional storage such as removable storage or non-removable storage, including, but not limited to, magnetic storage, optical storage, and the like. Such additional storage is illustrated in FIG. 10 by storage 1020. In an embodiment, computer readable instructions to implement one or more embodiments provided herein are in storage 1020. Storage 1020 also stores other computer readable instructions to implement an operating system, an application program, and the like. Computer readable instructions are loaded in memory 1018 for execution by processing unit 1016, for example.

The term "computer readable media" as used herein includes computer storage media. Computer storage media includes volatile and nonvolatile, removable and non-removable media implemented in any method or technology for storage of information such as computer readable instructions or other data. Memory 1018 and storage 1020 are examples of computer storage media. Computer storage media includes, but is not limited to, RAM, ROM, electrically erasable programmable read-only memory (EEPROM), flash memory or other memory technology, compact disc read-only memory (CD-ROM), DVDs or other optical storage, magnetic cassettes, magnetic tape, magnetic disk storage or other magnetic storage devices, or any other medium which can be used to store the desired information and which can be accessed by device 1012. Any such computer storage media is part of device 1012.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 1012 includes input device(s) 1024 such as keyboard, mouse, pen, voice input device, touch input device, infrared cameras, video input devices, or any other input device. Output device(s) 1022 such as one or more displays, speakers, printers, or any other output device are also included in device 1012. Input device(s) 1024 and output device(s) 1022 are connected to device 1012 via a wired connection, wireless connection, or any combination thereof. In an embodiment, an input device or an output device from another computing device are used as input device(s) 1024 or output device(s) 1022 for computing device 1012. Device 1012 also includes communication connection(s) 1026 to facilitate communications with one or more other devices.

The use of pressure cylinders 224, 226 with different applied pressures allows the appropriate force to be applied to the semiconductor die associated with the pressure cylinder 224, 226 based on the pin count to account for the counter force from the conductive pins 210. The use of a force that depends on the pin count reduces the likelihood of damage to the integrated circuit package 200, damage to the semiconductor dies in the integrated circuit package 200, or damage to the device tester 116. During an initial engagement with the device tester 116, a preliminary pressure corresponding to a reduced force may be applied to verify alignment with between the integrated circuit package 200 and the socket 208 of the device tester 116. In some embodiments, the use of the preliminary pressure allows a degree of warpage to be determined. During testing, a pressure is applied to the pressure cylinders 224, 226 that has an applied force that is less than a maximum force determined based on the pin count and the pin force. The pressure applied during the test may be adjusted based on the estimated degree of warpage or the test results for the integrated circuit package 200.

According to some embodiments, a system for testing an integrated circuit package is provided. The system includes a device tester. The device tester includes a socket, a cylinder head unit engageable with the socket, and a pressure regulator. The socket includes a first pressure cylinder configured to engage a first region of the integrated circuit package and a second pressure cylinder configured to engage a second region of the integrated circuit package. The pressure regulator is configured to provide a gas at a first pressure to the first pressure cylinder and to provide the gas at a second pressure different than the first pressure to the second pressure cylinder.

According to some embodiments, a method for testing an integrated circuit package is provided. The method includes interfacing the integrated circuit package in a socket of a device tester. A first force is applied to a first region of the integrated circuit package using a first pressure cylinder. A second force different than the first force is applied to a second region of the integrated circuit package using a second pressure cylinder. A first test of the integrated circuit package is performed using the device tester.

According to some embodiments, a system is provided. The system includes a socket, a cylinder head unit engageable with the socket, and a pressure regulator. The cylinder head unit includes a first pressure cylinder configured to engage a first region of an integrated circuit package, a second pressure cylinder configured to engage a second region of the integrated circuit package, a third pressure cylinder configured to engage a third region of the integrated circuit package, a first pressure cavity in fluid communication with the first pressure cylinder, and a second pressure cavity in fluid communication with the second pressure cylinder and the third pressure cylinder. The pressure regulator is configured to provide a first pressure to the first pressure cavity and a second pressure different than the first pressure to the second pressure cavity.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and case of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having". "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is not limited thereto. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one or more of several implementations, such feature may be combined with one or more other features of the other implementations as may be desired and advantageous for any given or particular application.

What is claimed is:

1. A system for testing an integrated circuit package, comprising:
   a device tester, comprising:
      a socket;
      a cylinder head unit engageable with the socket, comprising:
         a first pressure cylinder configured to engage a first region of the integrated circuit package; and
         a second pressure cylinder configured to engage a second region of the integrated circuit package;
      a pressure regulator configured to provide a gas at a first pressure to the first pressure cylinder and to provide the gas at a second pressure different than the first pressure to the second pressure cylinder;
      a first gas inlet connected between the pressure regulator and the cylinder head unit; and
      a second gas inlet connected between the pressure regulator and the cylinder head unit, wherein the gas comprises at least one of air or an inert gas.

2. The system of claim 1, wherein the cylinder head unit comprises:
   a third pressure cylinder; and
   a pressure cavity in fluid communication with the first pressure cylinder and the third pressure cylinder.

3. The system of claim 1, wherein:
   the first pressure is based on a pin count of a first semiconductor die of the integrated circuit package in the first region, and
   the second pressure is based on a pin count of a second semiconductor die of the integrated circuit package in the second region.

4. The system of claim 1, wherein:
   the socket comprises a conductive pin having an associated pin force for deflecting the conductive pin, and
   the first pressure is based on a pin count of a first semiconductor die of the integrated circuit package in the first region and the associated pin force.

5. The system of claim 4, wherein:
   the first pressure corresponds to a first force that is a fraction of a maximum force defined by the pin count and the associated pin force.

6. The system of claim 1, comprising:
   a prober configured to configure the first pressure and the second pressure in the device tester, wherein:
      the first pressure and the second pressure are employed by the device tester during a test of the integrated circuit package,
      the prober is configured to provide a third pressure and a fourth pressure for a preliminary engagement between the integrated circuit package and the device tester,
      the pressure regulator is configured to provide the gas at the third pressure to the first pressure cylinder and to provide the gas at the fourth pressure to the second pressure cylinder during the preliminary engagement, the third pressure is less than the first pressure, and the fourth pressure is less than the second pressure.

7. The system of claim 1, comprising:

a prober configured to configure the first pressure and the second pressure in the device tester, wherein:

the first pressure and the second pressure are employed by the device tester during a first test of the integrated circuit package, the prober is configured to provide a third pressure and a fourth pressure for a second test of the integrated circuit package responsive to a fail result of the first test, the pressure regulator is configured to provide the gas at the third pressure to the first pressure cylinder and to provide the gas at the fourth pressure to the second pressure cylinder during the second test, the third pressure is greater than the first pressure, and the fourth pressure is greater than the second pressure.

8. A method, comprising:

interfacing an integrated circuit package in a socket of a device tester;

providing a first pressure to a first pressure cylinder to apply a first force to a first region of the integrated circuit package using the first pressure cylinder;

providing a second pressure to a second pressure cylinder to apply a second force different than the first force to a second region of the integrated circuit package using the second pressure cylinder;

providing the first pressure to a third pressure cylinder to apply a third force to a third region of the integrated circuit package; and performing a first test of the integrated circuit package using the device tester.

9. The method of claim 8, comprising:

configuring the first pressure based on a pin count of a first semiconductor die of the integrated circuit package in the first region, and configuring the second pressure based on a pin count of a second semiconductor die of the integrated circuit package in the second region.

10. The method of claim 8, wherein:

the socket comprises a conductive pin having an associated pin force for deflecting the conductive pin, and the method comprises configuring the first pressure based on a pin count of a first semiconductor die of the integrated circuit package in the first region and the associated pin force.

11. The method of claim 10, wherein configuring the first pressure comprises:

configuring the first pressure to provide the first force as a fraction of a maximum force defined by the pin count and the associated pin force.

12. The method of claim 11, wherein configuring the first pressure comprises:

configuring the first pressure based on a surface area of the first pressure cylinder.

13. The method of claim 8, comprising:

providing a third pressure less than the first pressure to the first pressure cylinder to apply a fourth force to the first region of the integrated circuit package during a preliminary engagement between the socket and the integrated circuit package; and providing a fourth pressure less than the second pressure to the first pressure cylinder to apply a fifth force to the second region of the integrated circuit package during the preliminary engagement.

14. The method of claim 13, comprising:

modifying the first pressure and the second pressure prior to performing the first test based on the preliminary engagement.

15. The method of claim 8, comprising:

responsive to a fail result of the first test:

applying a fourth force greater than the first force to the first region of the integrated circuit package using the first pressure cylinder;

applying a fifth force greater than the second force to the second region of the integrated circuit package using the second pressure cylinder; and performing a second test of the integrated circuit package using the device tester.

16. A system, comprising:

a socket;

a cylinder head unit engageable with the socket, comprising:

a first pressure cylinder configured to engage a first region of an integrated circuit package;

a second pressure cylinder configured to engage a second region of the integrated circuit package;

a third pressure cylinder configured to engage a third region of the integrated circuit package;

a first pressure cavity in fluid communication with the first pressure cylinder; and a second pressure cavity in fluid communication with the second pressure cylinder and the third pressure cylinder; and a pressure regulator configured to provide a first pressure to the first pressure cavity and a second pressure different than the first pressure to the second pressure cavity.

17. The system of claim 16, wherein:

the first pressure is based on a pin count of a first semiconductor die of the integrated circuit package in the first region, and the second pressure is based on a pin count of a second semiconductor die of the integrated circuit package in the second region.

18. The system of claim 16, wherein:

the socket comprises a conductive pin having an associated pin force for deflecting the conductive pin, and the first pressure is based on a pin count of a first semiconductor die of the integrated circuit package in the first region and the associated pin force.

19. The system of claim 18, wherein:

the first pressure corresponds to a first force that is a fraction of a maximum force defined by the pin count and the associated pin force.

20. The system of claim 16, comprising:

a first gas inlet connected between the pressure regulator and the cylinder head unit; and a second gas inlet connected between the pressure regulator and the cylinder head unit.

\* \* \* \* \*